US010396480B2

(12) United States Patent
Lee et al.

(10) Patent No.: US 10,396,480 B2
(45) Date of Patent: Aug. 27, 2019

(54) BOARD-TO-BOARD PLUG ELECTRICAL PLUG CONNECTOR, BOARD-TO-BOARD ELECTRICAL RECEPTACLE CONNECTOR, AND BOARD-TO-BOARD ELECTRICAL CONNECTOR ASSEMBLY

(71) Applicant: ADVANCED-CONNECTEK INC., New Taipei (TW)

(72) Inventors: Kuo-Ching Lee, New Taipei (TW); Mao-Sheng Chen, New Taipei (TW); Cheng-Feng Yu, New Taipei (TW); Ta-Teh Meng, New Taipei (TW)

(73) Assignee: ADVANCED-CONNECTEK INC., New Taipei (TW)

( * ) Notice: Subject to any disclaimer, the term of this patent is extended or adjusted under 35 U.S.C. 154(b) by 0 days.

(21) Appl. No.: 16/172,387

(22) Filed: Oct. 26, 2018

(65) Prior Publication Data

US 2019/0131731 A1 May 2, 2019

(30) Foreign Application Priority Data

Oct. 27, 2017 (TW) ............................ 106215980 U

(51) Int. Cl.

| | |
|---|---|
| ***H01R 13/648*** | (2006.01) |
| ***H01R 12/71*** | (2011.01) |
| ***H01R 13/24*** | (2006.01) |
| ***H05K 1/14*** | (2006.01) |
| ***H01R 13/405*** | (2006.01) |
| ***H01R 13/20*** | (2006.01) |

(52) U.S. Cl.

CPC ........... *H01R 12/716* (2013.01); *H01R 13/20* (2013.01); *H01R 13/2492* (2013.01); *H01R 13/405* (2013.01); *H05K 1/14* (2013.01)

(58) Field of Classification Search

CPC .............. H01R 12/716; H01R 13/2492; H01R 13/405; H01R 13/20; H01R 13/7035; H01R 13/7033; H01R 4/5025; H01R 13/6471; H01R 4/185; B25F 5/00

USPC ..................................................... 439/607.01

See application file for complete search history.

(56) References Cited

U.S. PATENT DOCUMENTS 7,513,778 B1 * 4/2009 Dar-Shan ........... H01R 13/7033 439/188

2005/0095908 A1 * 5/2005 Xue .................. H01R 13/7035 439/541.5

(Continued)

*Primary Examiner* — Jean F Duverne

(74) *Attorney, Agent, or Firm* — Muncy, Geissler, Olds & Lowe, P.C.

(57) ABSTRACT

An electrical plug connector includes a plug insulated housing, first plug terminals, and second plug terminals. The plug insulated housing includes a bottom wall, a first side wall, a second side wall, and two end walls connected to the first side wall and the second side wall to enclose an insertion cavity. First plug-terminal assembling portions are on the first side wall. Second plug-terminal assembling portions are on the second side wall. The first plug-terminal assembling portions correspond to the second plug-terminal assembling portions in a one-to-one manner. The first plug terminals include one or more pair of first plug signal terminals. The second plug terminals include one or more pair of second plug signal terminals. The pair of the first plug signal terminals is shifted relative to the pair of the second plug signal terminals along a transversal direction.

13 Claims, 7 Drawing Sheets

(56) References Cited

U.S. PATENT DOCUMENTS

| | | | | |
|---|---|---|---|---|
| 2005/0159041 | A1* | 7/2005 | Holliday | H01R 4/5025<br>439/500 |
| 2009/0229578 | A1* | 9/2009 | Lin | F02D 41/20<br>123/476 |
| 2010/0319192 | A1* | 12/2010 | Takahashi | H01R 4/185<br>29/753 |
| 2016/0064866 | A1* | 3/2016 | Kao | H01R 13/6471<br>439/676 |
| 2018/0233006 | A1* | 8/2018 | Koniarek | B25F 5/00 |

* cited by examiner

| | | | | | | | | | | | | | | | | | | | |
|---|---|---|---|---|---|---|---|---|---|---|---|---|---|---|---|---|---|---|---|
| GND | SS_1+ | SS_1- | GND | GND | SS_3+ | SS_3- | GND | GND | SS_5+ | SS_5- | GND | GND | SS_7+ | SS_7- | GND | GND | SS_9+ | SS_9- | GND |
| GND | GND | SS_2+ | SS_2- | GND | GND | SS_4+ | SS_4- | GND | GND | SS_6+ | SS_6- | GND | GND | SS_8+ | SS_8- | GND | GND | GND | GND |

FIG.2A

| | | | | | | | | | | | | | | | | | | | |
|---|---|---|---|---|---|---|---|---|---|---|---|---|---|---|---|---|---|---|---|
| GND | SS_1+ | SS_1- | GND | GND | SS_3+ | SS_3- | GND | GND | SS_5+ | SS_5- | GND | GND | SS_7+ | SS_7- | GND | GND | SS_9+ | SS_9- | GND |
| GND | GND | GND | SS_2+ | SS_2- | GND | GND | SS_4+ | SS_4- | GND | GND | SS_6+ | SS_6- | GND | GND | SS_8+ | SS_8- | GND | GND | GND |

FIG.2B

| | | | | | | | | | | | | | | | | | | | |
|---|---|---|---|---|---|---|---|---|---|---|---|---|---|---|---|---|---|---|---|
| GND | SS_1+ | SS_1- | GND | GND | GND | GND | SS_3+ | SS_3- | GND | GND | GND | GND | SS_5+ | SS_5- | GND | GND | GND | GND | GND |
| GND | GND | GND | GND | SS_2+ | SS_2- | GND | GND | GND | GND | SS_4+ | SS_4- | GND | GND | GND | GND | SS_6+ | SS_6- | GND | GND |

FIG.2C

| | | | | | | | | | | | |
|---|---|---|---|---|---|---|---|---|---|---|---|
| GND | SS_1+ | SS_1- | GND | GND | SS_3+ | SS_3- | GND | GND | SS_5+ | SS_5- | GND |
| GND | GND | GND | SS_2+ | SS_2- | GND | GND | SS_4+ | SS_4- | GND | GND | GND |

FIG.4A

| | | | | | | | | | | | | | | |
|---|---|---|---|---|---|---|---|---|---|---|---|---|---|---|
| GND | SS_1+ | SS_1- | GND | GND | SS_3+ | SS_3- | GND | GND | SS_5+ | SS_5- | GND | GND | GND | GND |
| GND | GND | GND | SS_2+ | SS_2- | GND | GND | SS_4+ | SS_4- | GND | GND | SS_6+ | SS_6- | GND | GND |

FIG.4B

BOARD-TO-BOARD PLUG ELECTRICAL PLUG CONNECTOR, BOARD-TO-BOARD ELECTRICAL RECEPTACLE CONNECTOR, AND BOARD-TO-BOARD ELECTRICAL CONNECTOR ASSEMBLY

CROSS-REFERENCE TO RELATED APPLICATION

This non-provisional application claims priority under 35 U.S.C. § 119(a) to Patent Application No. 106215980 in Taiwan, R.O.C. on Oct. 27, 2017, the entire contents of which are hereby incorporated by reference.

FIELD OF THE INVENTION

The instant disclosure relates to an electrical connector, and more particular to a board-to-board electrical plug connector, a board-to-board electrical receptacle connector, and a board-to-board electrical connector assembly.

BACKGROUND

Electrical devices, especially portable products, tend to become smaller, thinner, and lighter. An electrical device usually comprises different circuit boards therein which need to be electrically connected to each other. In order to improve the utilization rate of space inside the electrical device, the different circuit boards are usually applied with a board to board (BTB) electrical connector for electrical connection.

SUMMARY OF THE INVENTION

The BTB electrical connector is an electrical connector assembly. In general, the electrical connector assembly comprises a plug connector and a receptacle connector corresponding to the plug connector. Currently, because electrical devices tend to become smaller, thinner, and lighter, the distances between terminals of the connectors in the electrical devices are also reduced. As a result, crosstalk issues are raised. Therefore, the structures of the connectors are continuously modified to reduce the crosstalk problems.

In view of this, an embodiment of the instant disclosure provides an electrical plug connector. The electrical plug connector comprises a plug insulated housing, a plurality of first plug terminals, and a plurality of second plug terminals. The plug insulated housing comprises a bottom wall, a first side wall, a second side wall, and two end walls. The first side wall and the second side wall are upwardly extending from two transversal sides of the bottom wall, respectively. The two end walls are upwardly extending from two longitudinal sides of the bottom wall, respectively. The first side wall corresponds to the second side wall. The two end walls are respectively connected to the first side wall and the second side wall to enclose an insertion cavity. A plurality of first plug-terminal assembling portions is on the first side wall. A plurality of second plug-terminal assembling portions is on the second side wall. The first plug-terminal assembling portions correspond to the second plug-terminal assembling portions in a one-to-one manner in a longitudinal direction parallel to the end walls. Each of the first plug terminals is assembled on one of the first plug-terminal assembling portions. The first plug terminals comprise at least one pair of first plug signal terminals, and the at least one pair of the first plug signal terminals is adjacently arranged with each other along a transversal direction. Each of the second plug terminals is assembled on one of the second plug-terminal assembling portions. The second plug terminals comprise at least one pair of second plug signal terminals, and the at least one pair of the second plug signal terminals is adjacently arranged with each other along the transversal direction. The at least one pair of the first plug signal terminals is shifted relative to the at least one pair of the second plug signal terminals along the transversal direction.

In view of this, another embodiment of the instant disclosure further provides an electrical receptacle connector. The electrical receptacle connector comprises a receptacle insulated housing, a plurality of first receptacle terminals, and a plurality of second receptacle terminals. The receptacle insulated housing comprises a bottom plate, a first side plate, a second side plate, and two end plates. The first side plate and the second side plate are upwardly extending from two transversal sides of the bottom plate, respectively. The tongue portion is upwardly extending from the bottom plate and parallel to the first side plate and the second side plate. The two end plates are upwardly extending from two longitudinal sides of the bottom plate, respectively, and the two end plates are connected to the first side plate and the second side plate, respectively to enclose an insertion space. The tongue portion is occupied in the intermediate of the insertion space. A plurality of first receptacle-terminal assembling portions and a plurality of second receptacle-terminal assembling portions are respectively on two sides of the tongue portion. The first receptacle-terminal assembling portions correspond to the second receptacle-terminal assembling portions in a one-to-one manner in a longitudinal direction parallel to the end plates. Each of the first receptacle terminals is assembled on one of the first receptacle-terminal assembling portions. The first receptacle terminals comprise at least one pair of first receptacle signal terminals, and the at least one pair of the first receptacle signal terminals is adjacently arranged with each other along a transversal direction. Each of the second receptacle terminals is assembled on one of the second receptacle-terminal assembling portions. The second receptacle terminals comprise at least one pair of second receptacle signal terminals, and the at least one pair of the second receptacle signal terminals is adjacently arranged with each other along the transversal direction. The at least one pair of the first receptacle signal terminals is shifted relative to the at least one pair of the second receptacle signal terminals along the transversal direction.

In view of this, yet another embodiment of the instant disclosure further provides an electrical connector assembly. The electrical connector assembly comprises an electrical plug connector and an electrical receptacle connector. The electrical plug connector comprises a plug insulated housing, a plurality of first plug terminals, and a plurality of second plug terminals. The plug insulated housing comprises a bottom wall, a first side wall, a second side wall, and two end walls. The first side wall and the second side wall are upwardly extending from two transversal sides of the bottom wall, respectively. The two end walls are upwardly extending from two longitudinal sides of the bottom wall, respectively. The first side wall corresponds to the second side wall. The two end walls are respectively connected to the first side wall and the second side wall to enclose an insertion cavity. A plurality of first plug-terminal assembling portions is on the first side wall. A plurality of second plug-terminal assembling portions is on the second side wall. The first plug-terminal assembling portions correspond to the second plug-terminal assembling portions in a oneto-one manner in a longitudinal direction parallel to the end walls. Each of the first plug terminals is assembled on one of the first plug-terminal assembling portions. The first plug terminals comprise at least one pair of first plug signal terminals, and the at least one pair of the first plug signal terminals is adjacently arranged with each other along a transversal direction. Each of the second plug terminals is assembled on one of the second plug-terminal assembling portions. The second plug terminals comprise at least one pair of second plug signal terminals, and the at least one pair of the second plug signal terminals is adjacently arranged with each other along the transversal direction. The at least one pair of the first plug signal terminals is shifted relative to the at least one pair of the second plug signal terminals along the transversal direction. The electrical receptacle connector comprises a receptacle insulated housing, a plurality of first receptacle terminals, and a plurality of second receptacle terminals. The receptacle insulated housing comprises a bottom plate, a first side plate, a second side plate, a tongue portion, and two end plates. The first side plate and the second side plate are upwardly extending from two transversal sides of the bottom plate, respectively, the tongue portion is upwardly extending from the bottom plate and parallel to the first side plate and the second side plate. The two end plates are upwardly extending from two longitudinal sides of the bottom plate, respectively, and the two end plates are respectively connected to the first side plate and the second side plate to enclose an insertion space. The tongue portion is occupied in the intermediate of the insertion space and the tongue portion corresponds to the insertion cavity. A plurality of first receptacle-terminal assembling portions and a plurality of second receptacle-terminal assembling portions are respectively on two sides of the tongue portion. The first receptacle-terminal assembling portions correspond to the second receptacle-terminal assembling portions in a one-to-one manner in the longitudinal direction parallel to the end plates. Each of the first receptacle terminals is assembled on one of the first receptacle-terminal assembling portions. The first receptacle terminals comprise at least one pair of first receptacle signal terminals, and the at least one pair of the first receptacle signal terminals is adjacently arranged with each other along the transversal direction. Each of the second receptacle terminals is assembled on one of the second receptacle-terminal assembling portions. The second receptacle terminals comprise at least one pair of second receptacle signal terminals, and the at least one pair of the second receptacle signal terminals is adjacently arranged with each other along the transversal direction. The at least one pair of the first receptacle signal terminals is shifted relative to the at least one pair of the second receptacle signal terminals.

According to some embodiments of the instant disclosure, the pin assignments of the signal terminals of the electrical plug connector and that of the electrical receptacle connector are respectively adjusted to have an offset configuration. Therefore, the crosstalk problems between the signal terminals during signal transmission can be improved. Consequently, the overall manufacturing cost for the connectors can be reduced and the product delivery rate can be improved.

Detailed description of the characteristics and the advantages of the instant disclosure are shown in the following embodiments. The technical content and the implementation of the instant disclosure should be readily apparent to any person skilled in the art from the detailed description, and the purposes and the advantages of the instant disclosure should be readily understood by any person skilled in the art with reference to content, claims, and drawings in the instant disclosure.

BRIEF DESCRIPTION OF THE DRAWINGS

The instant disclosure will become more fully understood from the detailed description given herein below for illustration only, and thus not limitative of the instant disclosure, wherein:

FIG. 2A illustrates a schematic configuration diagram of a first embodiment of plug terminals of the board-to-board electrical plug connector as shown in FIGS. 1A and 1B;

FIG. 2B illustrates a schematic configuration diagram of a second embodiment of the plug terminals of the board-to-board electrical plug connector as shown in FIGS. 1A and 1B;

FIG. 2C illustrates a schematic configuration diagram of a third embodiment of the plug terminals of the board-to-board electrical plug connector as shown in FIGS. 1A and 1B;

FIGS. 4A to 4C illustrate schematic configuration diagrams of further another embodiment of the plug terminals of the board-to-board electrical plug connector;

DETAILED DESCRIPTION

Figure 1A:
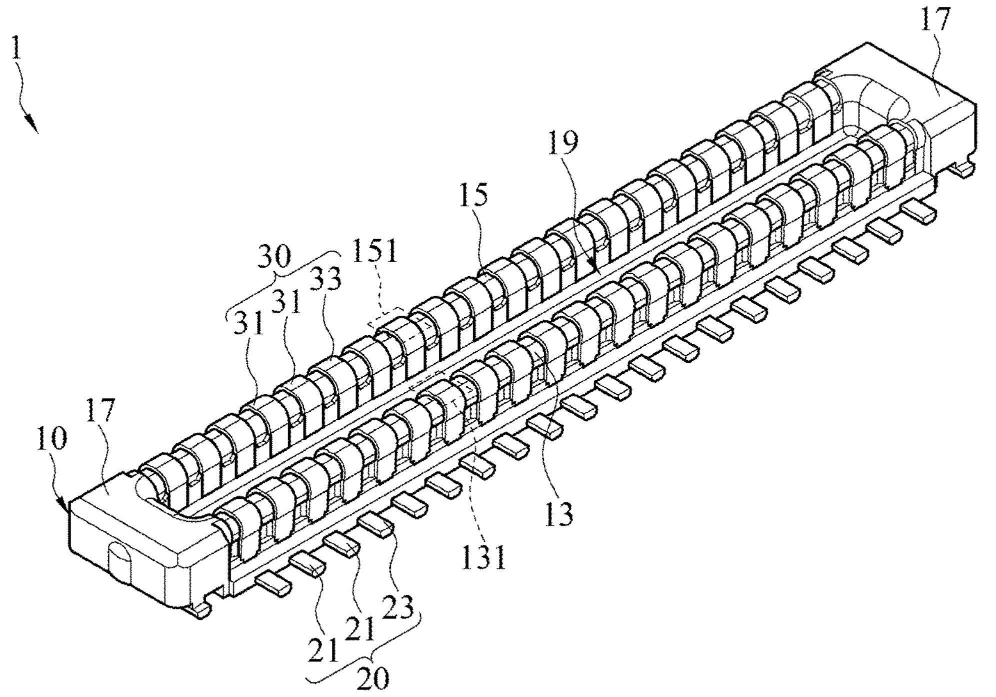
FIG. 1A illustrates a perspective view of a board-to-board electrical plug connector of an exemplary embodiment of the instant disclosure.
Figure 1B:
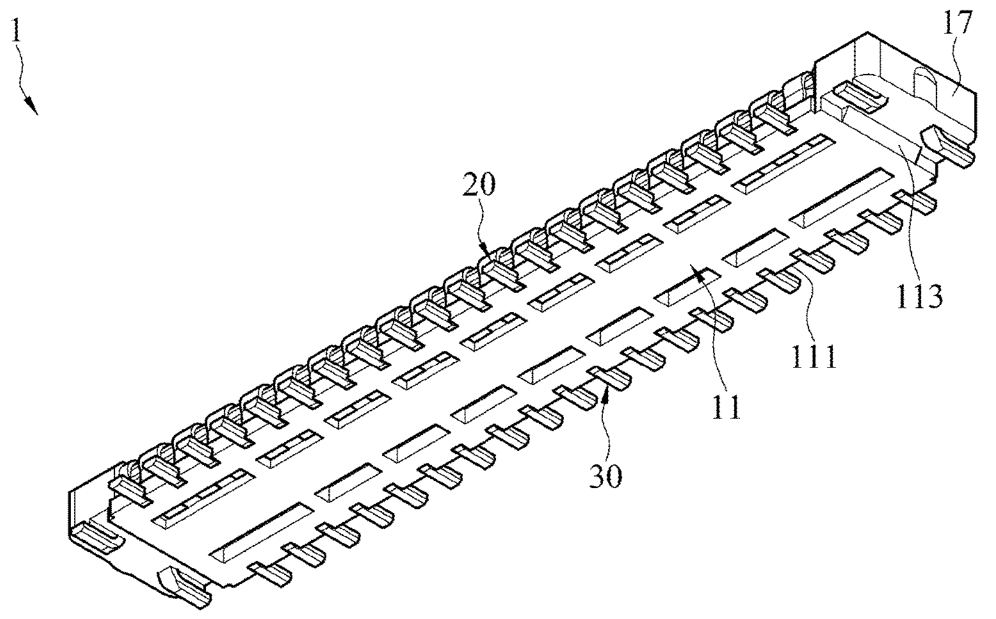
FIG. 1B illustrates another perspective view of the board-to-board electrical plug connector.

FIG. 1A illustrates a perspective view of a board-to-board electrical plug connector of an exemplary embodiment of the instant disclosure. FIG. 1B illustrates another perspective view of the board-to-board electrical plug connector. Please refer to FIGS. 1 and 2, the board-to-board electrical plug connector 1 comprises a plug insulated housing 10, a plurality of first plug terminals 20, and a plurality of second plug terminals 30. The plug insulated housing 10 comprises a bottom wall 11, a first side wall 13, a second side wall 15, and two end walls 17. The first side wall 13 and the second side wall 15 are upwardly extending from two transversal sides 111 of the bottom wall 11, respectively. The two end walls 17 are upwardly extending from two longitudinal sides 113 of the bottom wall 11, respectively, and the two end walls 17 are further extending in a longitudinal direction perpendicular to a transversal direction which is parallel to the transversal sides 111. The first side wall 13 corresponds to the second side wall 15. The two end walls 17 are respectively connected to the first side wall 13 and the second side wall 15. The first side wall 13, the second side wall 15, and the two end walls 17 enclose an insertion cavity 19. A plurality of first plug-terminal assembling portions 131 is on the first side wall 13, and a plurality of second plug-terminal assembling portions 151 is on the second side wall 15. The first plug-terminal assembling portions 131 correspond to the second plug-terminal assembling portions 151 in a one-to-one manner in a direction parallel to the end walls 17.

The first plug terminals 20 and the second plug terminals 30 may be reversed U shaped and respectively assembled on the first plug-terminal assembling portions 131 and the second plug-terminal assembling portions 151. In this embodiment, the number of the first plug-terminal assembling portions 131 may be greater than the number of the first plug terminals 20, and the number of the second plug-terminal assembling portions 151 may be greater than the number of the second plug terminals 30. In other words, some of the first plug-terminal assembling portions 131 and the second plug-terminal assembling portions 151 may be not occupied by plug terminals 20, 30. The first plug terminals 20 comprise at least one pair of first plug signal terminals 21, and the at least one pair of the first plug signal terminals 21 is adjacently arranged with each other. The second plug terminals 30 comprise at least one pair of second plug signal terminals 31, and the at least one pair of the second plug signal terminals 31 is adjacently arranged with each other. The at least one pair of the first plug signal terminals 21 is shifted relative to the at least one pair of the second plug signal terminals 31 along the transversal direction. Hence the at least one pair of the first plug signal terminals 21 is misaligned with the at least one pair of the second plug signal terminals 31 in the longitudinal direction parallel to the end walls 17. In other words, at least one terminal of the at least one pair of the first plug signal terminals 21 is not aligned with the corresponding terminal of the at least one pair of the second plug signal terminals 31.

FIG. 2A illustrates a schematic configuration diagram of a first embodiment of plug terminals of the board-to-board electrical plug connector as shown in FIGS. 1A and 1B. FIG. 2B illustrates a schematic configuration diagram of a second embodiment of the plug terminals of the board-to-board electrical plug connector as shown in FIGS. 1A and 1B. FIG. 2C illustrates a schematic configuration diagram of a third embodiment of the plug terminals of the board-to-board electrical plug connector as shown in FIGS. 1A and 1B. Please refer to FIGS. 1A, 1B, and 2A to 2C. As shown in FIGS. 2A to 2C, the board-to-board electrical plug connector 1 has forty pins of the terminals; namely, the board-to-board electrical plug connector 1 has twenty pins of the first plug terminals 20 and twenty pins of the second plug terminals 30. In this embodiment, the first plug signal terminals 21 are represented by SS_1+ and SS_1−, SS_3+ and SS_3−, SS_5+ and SS_5−, etc., and the second plug signal terminals 31 are represented by SS_2+ and SS_2−, SS_4+ and SS_4−, SS_6+ and SS_6−, etc. In practice, the first plug terminals 20 may comprise one or more pair of first plug signal terminals 21, and the second plug terminals 30 may comprise one or more pair of second plug signal terminals 31. It is understood that, the pin assignments shown in the figures are provided as illustrative purposes, but not limitations to the disclosure.

As shown in FIG. 2A, in a direction parallel to the first side wall 13 and the second side wall 15, the pair of the second plug signal terminals 31 is shifted relative to the pair of the first plug signal terminals 21 by an offset of one second plug-terminal assembling portion 131 along the transversal direction. In other words, one pin of the pair of the first plug signal terminals 21 is aligned with one pin of the pair of the second plug signal terminals 31 in the longitudinal direction, and the other pin of the pair of the first plug signal terminals 21 is not aligned with the other pin of the pair of the second plug signal terminals 31 in the longitudinal direction.

As shown in FIG. 2B, in the direction parallel to the first side wall 13 and the second side wall 15, the pair of the second plug signal terminals 31 is shifted relative to the pair of the first plug signal terminals 21 by an offset of two second plug-terminal assembling portions 131 along the transversal direction. In other words, both terminals of the pair of the first plug signal terminals 21 are not aligned with the pair of the second plug signal terminals 31 in the longitudinal direction. As shown in FIG. 2C, the pair of the second plug signal terminals 31 is shifted relative to the pair of the first plug signal terminals 21 by an offset of three plug-terminal assembling portions 131 along the transversal direction. In the embodiment shown in FIG. 2C, since the number of the overall plug-terminal assembling portions 111, 131 in the plug connector shown in FIGS. 2A to 2C is the same, the number of the plug signal terminals 21, 31 in FIG. 2C is less than the number of the plug signal terminals 21, 31 in FIG. 2A and is also less than the number of the plug signal terminals 21, 31 in FIG. 2B. In practice, the offset distance between the first plug signal terminals 21 and the corresponding second plug signal terminals 31 may be adjusted according to the number of the plug signal terminals 21, 31.

Furthermore, please refer to FIGS. 1 and 2A to 2C, the first plug terminals 20 further comprise a first plug ground terminal 23, and the first plug ground terminal 23 is at one side of the pair of the first plug signal terminals 21. As shown in FIGS. 2A to 2C, the plug ground terminals are represented by GND. The first plug ground terminals 23 may be plural and at two sides of the pair of the first plug signal terminals 21. Similarly, the second plug terminals 30 may further comprise a second plug ground terminal 33, and the second plug ground terminal 33 is at one side of the pair of the second plug signal terminals 31. The second plug ground terminals 33 may be plural and at two sides of the pair of the second plug signal terminals 31. In practice, the first plug terminals 20 may further comprise first plug power terminals (not shown), and the second plug terminals 30 may further comprise second plug power terminals (not shown), but embodiments are not limited thereto.

Figure 3A:
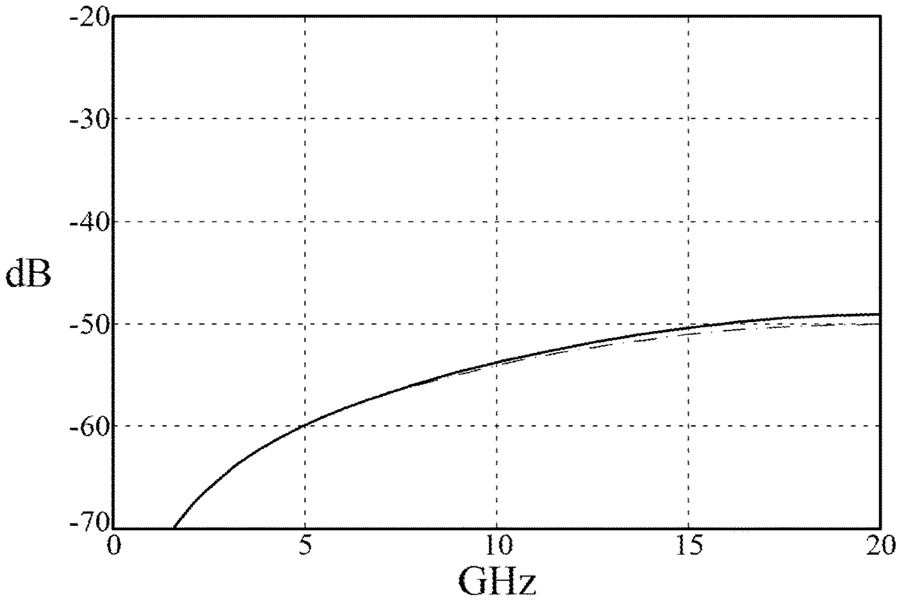
FIGS. 3A and 3B illustrate curves for comparing crosstalk effects of the board-to-board electrical plug connector.
Figure 3B:
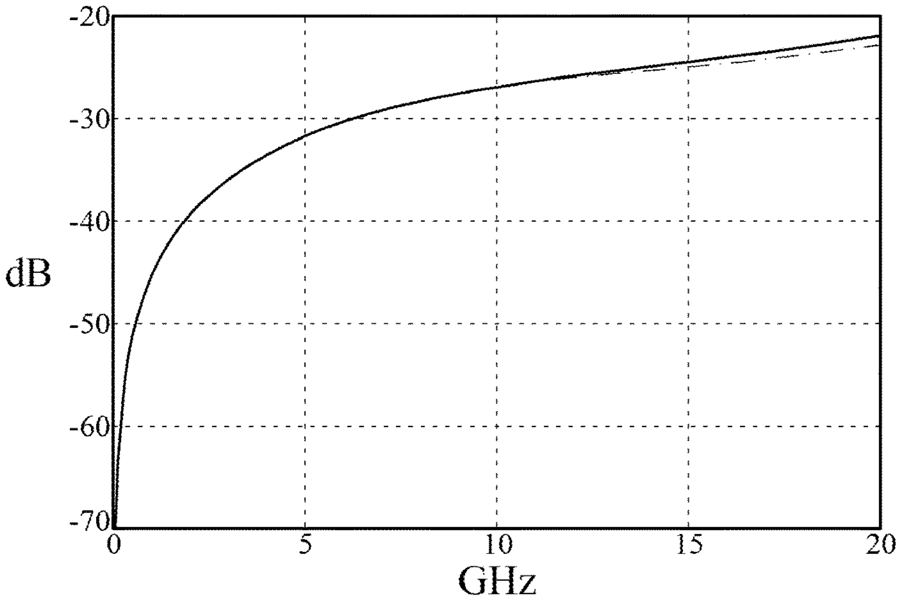

FIGS. 3A and 3B illustrate curves for comparing crosstalk effects of the board-to-board electrical plug connector. FIG. 3A shows an energy response curve of the connector shown in FIG. 2B, and FIG. 3B shows an energy response curve of a connector in which the first plug signal terminals 21 correspond to the second plug signal terminals 31 in position. The transversal axis corresponds to frequency (unit in GHz), the longitudinal axis corresponds to intensity (unit in dB), and the area below the curve corresponds to the energy generated by crosstalk upon signal transmission. As shown in FIGS. 3A and 3B, apparently, when the pair of the first plug signal terminals 21 and the pair of the second plug signal terminals 31 have an offset configuration, the crosstalk effect can be effectively reduced. Furthermore, according to experiments, when the offset distance between the pair of the first plug signal terminals 21 and the pair of the second plug signal terminals 31 increases, the area below the curve is further reduced, and the crosstalk effect can be further improved.

Figure 4C:
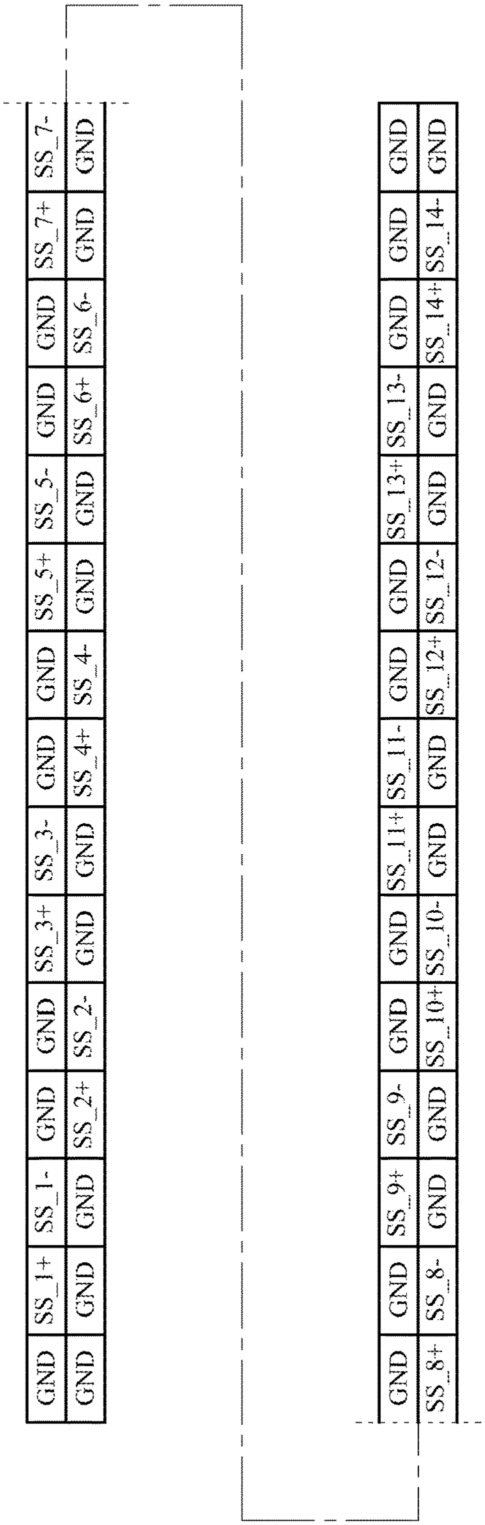

FIGS. 4A to 4C illustrate schematic configuration diagrams of further another embodiment of the plug terminals of the board-to-board electrical plug connector. In this embodiment, the number of the terminals of the board-to-board electrical plug connector 1 is not limited to the number of the terminals shown in FIGS. 2A to 2C. Alternatively, the board-to-board electrical plug connector 1 may have twenty four pins of the terminals, as shown in FIG. 4A; that is, the board-to-board electrical plug connector may have twelve pins of the first plug terminals 20 and twelve pins of the second plug terminals 30. In one embodiment, as shown in FIG. 4B, the board-to-board electrical plug connector 1 may have thirty pins of terminals, i.e., fifteen pins of the first plug terminals 20 and fifteen pins of the second plug terminals 30. In another embodiment, as shown in FIG. 4C, the board-to-board electrical plug connector 1 may have sixty pins of the terminals, i.e., thirty pins of the first plug terminals 20 and thirty pins of the second plug terminals 30. The number and the pin assignments of the terminals may be adjusted according to different requirements. However, it is noted that the pair of the first plug signal terminals 20 is misaligned with to the pair of the second plug signal terminals 30 to reduce the crosstalk effect effectively.

Figure 5A:
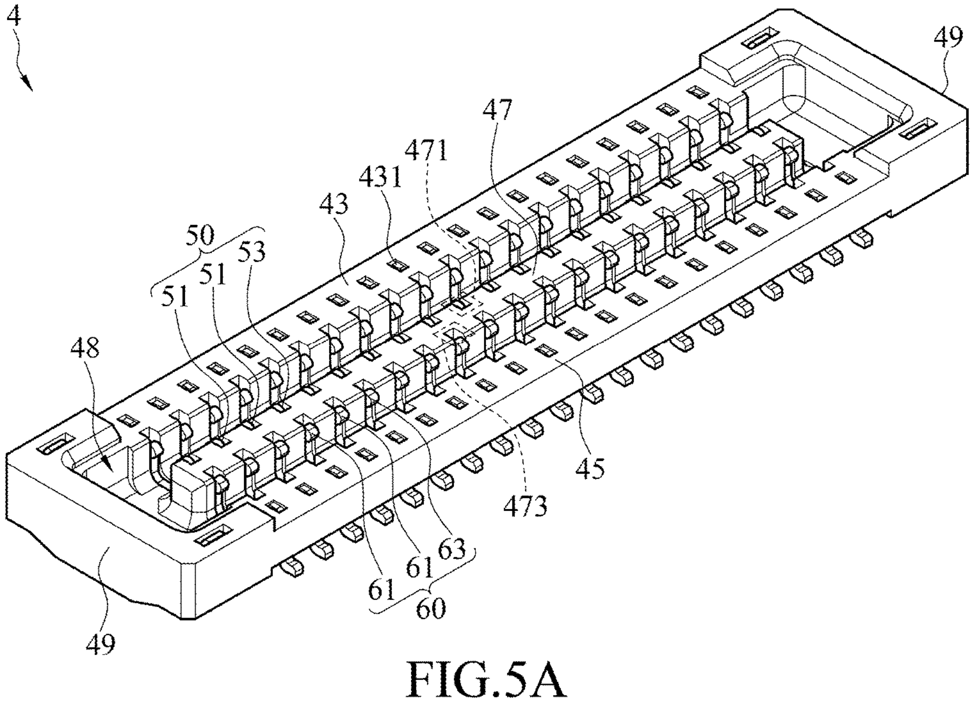
FIG. 5A illustrates a perspective view of a board-to-board electrical receptacle connector of an exemplary embodiment of the instant disclosure.
Figure 5B:
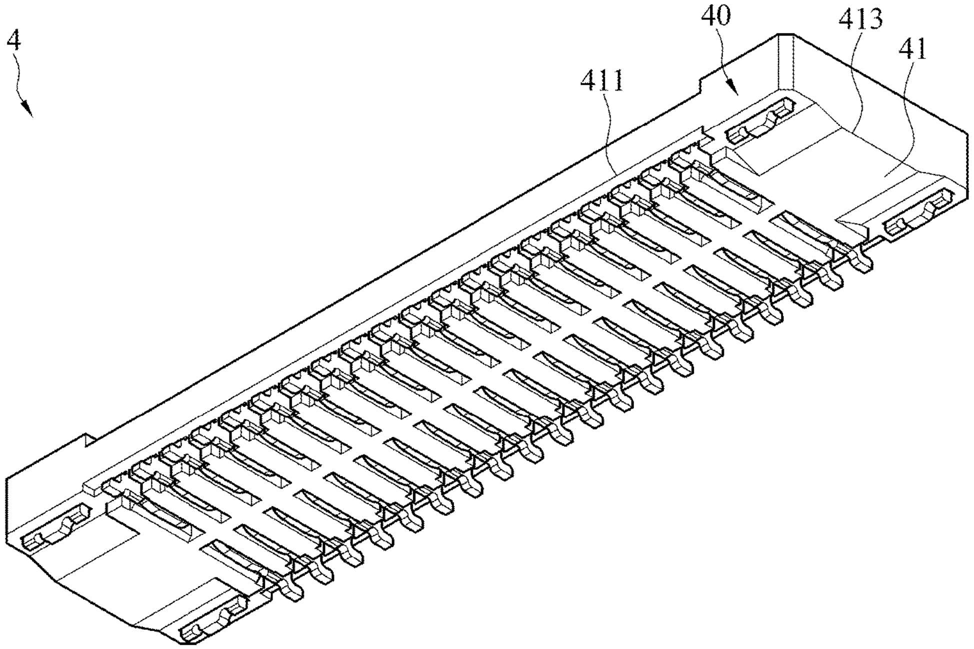
FIG. 5B illustrates another perspective view of the board-to-board electrical receptacle connector.

FIG. 5A illustrates a perspective view of a board-to-board electrical receptacle connector of an exemplary embodiment of the instant disclosure. FIG. 5B illustrates another perspective view of the board-to-board electrical receptacle connector. As shown in FIGS. 5A and 5B, the board-to-board electrical receptacle connector 4 comprises a receptacle insulated housing 40, a plurality of first receptacle terminals 50, and a plurality of second receptacle terminals 60. The receptacle insulated housing 40 comprises a bottom plate 41, a first side plate 43, a second side plate 45, a tongue portion 47, and two end plates 49. The first side plate 43 and the second side plate 45 are upwardly extending from two transversal sides 411 of the bottom plate 41, respectively. The tongue portion 47 is upwardly extending from the bottom plate 41, parallel to the first side plate 43 and the second side plate 45, and between the first side plate 43 and the second side plate 45. The two end plates 49 are respectively upwardly extending from two longitudinal sides 413 of the bottom plate 41, and the two end plates 49 are connected to the first side plate 43 and the second side plate 45, respectively, to enclose an insertion space 48. The tongue portion 47 is occupied in the intermediate of the insertion space 48. A plurality of first receptacle-terminal assembling portions 471 and a plurality of second receptacle-terminal assembling portions 473 are respectively on two sides of the tongue portion 47. In a longitudinal direction parallel to the end plates 49, the first receptacle-terminal assembling portions 471 correspond to the second receptacle-terminal assembling portions 473 in a one-to-one manner.

The first receptacle terminals 50 are assembled on the first receptacle-terminal assembling portions 471. In this embodiment, the first receptacle terminals 50 may be U shaped and assembled on the first receptacle-terminal assembling portions 471 and first assembling holes 431 on the first side plate 43 for positioning. The first receptacle terminals 50 comprise at least one pair of first receptacle signal terminals 51, and the at least one pair of the first receptacle signal terminals 51 is adjacently arranged with each other along a transversal direction. The second receptacle terminals 60 are assembled on the second receptacle-terminal assembling portions 473. The second receptacle terminals 60 may be U shaped and assembled on the second receptacle-terminal assembling portions 473 and second assembling holes 451 on the second side plate 45 for positioning. The second receptacle terminals 60 comprise at least one pair of second receptacle signal terminals 61, and the at least one pair of the second receptacle signal terminals 61 is adjacently arranged with each other along the transversal direction. The at least one pair of the first receptacle signal terminals 51 is misaligned with to the at least one pair of the second receptacle signal terminals 61 in the longitudinal direction parallel to the end walls 49.

The board-to-board electrical receptacle connector 4 is adapted to be assembled with the board-to-board electrical plug connector 1. Therefore, pin assignments of the first receptacle signal terminals 51 and the second receptacle signal terminals 61 correspond to pin assignments of the first plug signal terminals 21 and the second plug signal terminals 31. The pin assignments of the first receptacle signal terminals 51 and the second receptacle signal terminals 61 may be referred to the pin assignments shown in FIGS. 2A to 2C, and detailed description thereof will be omitted.

Furthermore, like the board-to-board electrical plug connector 1, the first receptacle terminals 50 of the board-to-board electrical receptacle connector 4 may further comprise one or more first receptacle ground terminal 53, and the first receptacle ground terminal(s) 53 may be at one side or two sides of the pair of the first receptacle signal terminals 51. Similarly, the second receptacle terminals 60 may further comprise one or more second receptacle ground terminal 63, and the second receptacle ground terminal(s) 63 may be at one side or two sides of the pair of the second receptacle signal terminals 61. In practice, the first receptacle terminals 50 may further comprise first receptacle power terminals (not shown), and the second receptacle terminals 60 may further comprise second receptacle power terminals (not shown), but embodiments are not limited thereto.

Figure 6:
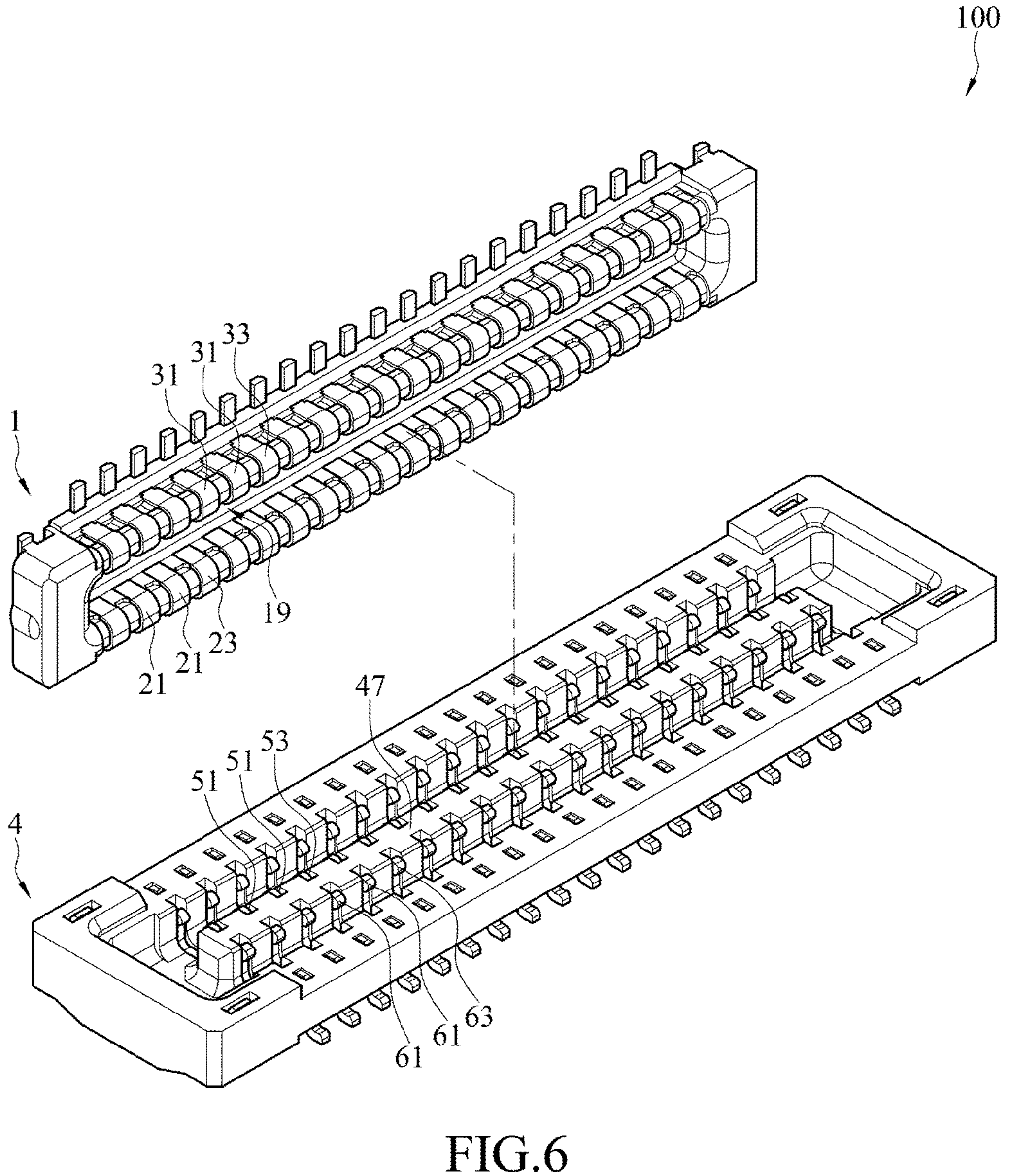
FIG. 6 illustrates a perspective view of a board-to-board electrical connector assembly of an exemplary embodiment of the instant disclosure.

FIG. 6 illustrates a perspective view of a board-to-board electrical connector assembly of an exemplary embodiment of the instant disclosure. As shown in FIG. 6, the board-to-board electrical connector assembly 100 comprises the aforementioned board-to-board electrical plug connector 1 and the aforementioned board-to-board electrical receptacle connector 4. The tongue portion 47 of the receptacle insulated housing 40 of the electrical receptacle connector 4 corresponds to the insertion cavity 19 of the plug insulated housing 10 of the electrical plug connector 1. The pair of the first plug signal terminals 21 corresponds to the pair of the first receptacle signal terminals 51, and the pair of the second plug signal terminals 31 corresponds to the pair of the second receptacle signal terminals 61. After the board-to-board electrical plug connector 1 is assembled with the board-to-board electrical receptacle connector 4, the tongue portion 47 is inserted into the insertion cavity 19, the first plug signal terminals 21 are in contact with the first receptacle signal terminals 51, and the second plug signal terminals 31 are in contact with the second receptacle signal terminals 61. Repeated descriptions are respectfully omitted.

According to some embodiments of the instant disclosure, the pin assignments of the signal terminals of the electrical plug connector and that of the electrical receptacle connector are respectively adjusted to have an offset configuration. Therefore, the crosstalk problems between the signal terminals during signal transmission can be improved. Consequently, the overall manufacturing cost for the connectors can be reduced and the product delivery rate can be improved.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An electrical plug connector, comprising:

a plug insulated housing comprising a bottom wall, a first side wall, a second side wall, and two end walls, wherein the first side wall and the second side wall are upwardly extending from two transversal sides of the bottom wall, respectively, the two end walls are upwardly extending from two longitudinal sides of the bottom wall, respectively, the first side wall corresponds to the second side wall, the two end walls are respectively connected to the first side wall and the second side wall to enclose an insertion cavity, wherein a plurality of first plug-terminal assembling portions is on the first side wall, a plurality of second plug-terminal assembling portions is on the second side wall, and the first plug-terminal assembling portions correspond to the second plug-terminal assembling portions in a one-to-one manner in a longitudinal direction parallel to the end walls;

a plurality of first plug terminals each assembled on one of the first plug-terminal assembling portions, wherein the first plug terminals comprise at least one pair of first plug signal terminals, and the at least one pair of the first plug signal terminals is adjacently arranged with each other; and a plurality of second plug terminals each assembled on one of the second plug-terminal assembling portions, wherein the second plug terminals comprise at least one pair of second plug signal terminals, the at least one pair of the second plug signal terminals is adjacently arranged with each other, and the at least one pair of the first plug signal terminals is shifted relative to the at least one pair of the second plug signal terminals along a transversal direction parallel to the first side wall and the second side wall.

2. The electrical plug connector according to claim 1, wherein the at least one pair of the second plug signal terminals is shifted relative to the at least one pair of the first plug signal terminals by an offset of one second plug-terminal assembling portion along the transversal direction.

3. The electrical plug connector according to claim 1, wherein the at least one pair of the second plug signal terminals is shifted relative to the at least one pair of the first plug signal terminals by at an offset of at least two of the second plug-terminal assembling portions along the transversal direction.

4. The electrical plug connector according to claim 1, wherein the first plug terminals further comprise a first plug ground terminal at one side of the at least one pair of the first plug signal terminals.

5. The electrical plug connector according to claim 4, wherein the second plug terminals further comprise a second plug ground terminal at one side of the at least one pair of the second plug signal terminals.

6. An electrical receptacle connector, comprising:

a receptacle insulated housing comprising a bottom plate, a first side plate, a second side plate, a tongue portion, and two end plates, wherein the first side plate and the second side plate are upwardly extending from two transversal sides of the bottom plate, respectively, the tongue portion is upwardly extending from the bottom plate and parallel to the first side plate and the second side plate, the two end plates are upwardly extending from two longitudinal sides of the bottom plate, respectively, and the two end plates are connected to the first side plate and the second side plate, respectively, to enclose an insertion space, the tongue portion is occupied in the intermediate of the insertion space, a plurality of first receptacle-terminal assembling portions and a plurality of second receptacle-terminal assembling portions are respectively on two sides of the tongue portion, wherein in a longitudinal direction parallel to the end plates, the first receptacle-terminal assembling portions correspond to the second receptacle-terminal assembling portions in a one-to-one manner;

a plurality of first receptacle terminals each assembled on one of the first receptacle-terminal assembling portions, wherein the first receptacle terminals comprise at least one pair of first receptacle signal terminals, and the at least one pair of the first receptacle signal terminals is adjacently arranged with each other along a transversal direction; and a plurality of second receptacle terminals each assembled on one of the second receptacle-terminal assembling portions, wherein the second receptacle terminals comprise at least one pair of second receptacle signal terminals, the at least one pair of the second receptacle signal terminals is adjacently arranged with each other along the transversal direction, and the at least one pair of the first receptacle signal terminals is shifted relative to the at least one pair of the second receptacle signal terminals.

7. The electrical receptacle connector according to claim 6, wherein the at least one pair of the second receptacle signal terminals is shifted relative to the at least one pair of the first receptacle signal terminals by an offset of one second receptacle-terminal assembling portion along the transversal direction which is parallel to the first side plate and the second side plate.

8. The electrical receptacle connector according to claim 6, wherein the at least one pair of the second receptacle signal terminals is shifted relative to the at least one pair of the first receptacle signal terminals by an offset of at least two of the second receptacle-terminal assembling portions along the transversal direction which is parallel to the first side plate and the second side plate.

9. The electrical receptacle connector according to claim 6, wherein the first receptacle terminals further comprise a first receptacle ground terminal at one side of the at least one pair of the first receptacle signal terminals.

10. The electrical receptacle connector according to claim 9, wherein the second receptacle terminals further comprise a second receptacle ground terminal at one side of the at least one pair of the second receptacle signal terminals.

11. An electrical connector assembly comprising:

an electrical plug connector, comprising:

a plug insulated housing comprising a bottom wall, a first side wall, a second side wall, and two end walls, wherein the first side wall and the second side wall are upwardly extending from two transversal sides of the bottom wall, respectively, the two end walls are upwardly extending from two longitudinal sides of the bottom wall, respectively, the first side wall corresponds to the second side wall, the two end walls are respectively connected to the first side wall and the second side wall to enclose an insertion cavity, wherein a plurality of first plug-terminal assembling portions is on the first side wall, a plurality of second plug-terminal assembling portions is on the second side wall, and the first plug-terminal assembling portions correspond to the second plug-terminal assembling portions in a one-to-one manner in a longitudinal direction parallel to the end walls;

a plurality of first plug terminals each assembled on one of the first plug-terminal assembling portions, wherein the first plug terminals comprise at least one pair of first plug signal terminals, and the at least one pair of the first plug signal terminals is adjacently arranged with each other along a transversal direction; and a plurality of second plug terminals each assembled on one of the second plug-terminal assembling portions, wherein the second plug terminals comprise at least one pair of second plug signal terminals, the at least one pair of the second plug signal terminals is adjacently arranged with each other along the transversal direction, and the at least one pair of the first plug signal terminals is shifted relative to the at least one pair of the second plug signal terminals; and an electrical receptacle connector comprising:

a receptacle insulated housing comprising a bottom plate, a first side plate, a second side plate, a tongue portion, and two end plates, wherein the first side plate and the second side plate are upwardly extending from two transversal sides of the bottom plate, respectively, the tongue portion is upwardly extending from the bottom plate and parallel to the first side plate and the second side plate, the two end plates are upwardly extending from two longitudinal sides of the bottom plate, respectively, and the two end plates are connected to the first side plate and the second side plate, respectively, to enclose an insertion space, the tongue portion is occupied in the intermediate of the insertion space and the tongue portion corresponds to the insertion cavity, a plurality of first receptacle-terminal assembling portions and a plurality of second receptacle-terminal assembling portions are respectively on two sides of the tongue portion, wherein the first receptacle-terminal assembling portions correspond to the second receptacle-terminal assembling portions in a one-to-one manner in the longitudinal direction parallel to the end plates;

a plurality of first receptacle terminals each assembled on one of the first receptacle-terminal assembling portions, wherein the first receptacle terminals comprise at least one pair of first receptacle signal terminals, and the at least one pair of the first receptacle signal terminals is adjacently arranged with each other along the transversal direction; and a plurality of second receptacle terminals each assembled on one of the second receptacle-terminal assembling portions, wherein the second receptacle terminals comprise at least one pair of second receptacle signal terminals, the at least one pair of the second receptacle signal terminals is adjacently arranged with each other along the transversal direction, and the at least one pair of the first receptacle signal terminals is shifted relative to the at least one pair of the second receptacle signal terminals, wherein the at least one pair of the first plug signal terminals corresponds to the at least one pair of the first receptacle signal terminals, and the at least one pair of the second plug signal terminals corresponds to the at least one pair of the second receptacle signal terminals.

12. The electrical connector assembly according to claim 11, wherein the at least one pair of the second plug signal terminals is shifted relative to the at least one pair of the first plug signal terminals by an offset of one second plug-terminal assembling portion, and the at least one pair of the second receptacle signal terminals is shifted relative to the at least one pair of the first receptacle signal terminals by an offset of one second receptacle-terminal assembling portion.

13. The electrical connector assembly according to claim 11, wherein the at least one pair of the second plug signal terminals is shifted relative to the at least one pair of the first plug signal terminals by an offset of at least two of the second plug-terminal assembling portions, and the at least one pair of the second receptacle signal terminals is shifted relative to the at least one pair of the first receptacle signal terminals by an offset of at least two of the second receptacle-terminal assembling portions.

* * * * *